(12) United States Patent
Keizer et al.

(10) Patent No.: US 10,373,914 B2
(45) Date of Patent: Aug. 6, 2019

(54) METHOD OF FABRICATING A THREE DIMENSIONAL ELECTRONIC STRUCTURE

(71) Applicant: NewSouth Innovations Pty Limited, Sydney NSW (AU)

(72) Inventors: Joris Gerhard Keizer, Seaforth (AU); Matthias Koch, Berlin (DE); Michelle Yvonne Simmons, Woollahra (AU)

(73) Assignee: NewSouth Innovations Pty Limited, Sydney, NSW (AU)

( * ) Notice: Subject to any disclaimer, the term of this patent is extended or adjusted under 35 U.S.C. 154(b) by 0 days.

(21) Appl. No.: 15/620,375

(22) Filed: Jun. 12, 2017

(65) Prior Publication Data
US 2018/0358300 A1    Dec. 13, 2018

(51) Int. Cl.
| | |
|---|---|
| *H01L 29/66* | (2006.01) |
| *H01L 23/544* | (2006.01) |
| *H01L 27/18* | (2006.01) |
| *H01L 39/22* | (2006.01) |
| *H01L 39/24* | (2006.01) |
| *G06T 7/00* | (2017.01) |
| *G06N 10/00* | (2019.01) |

(52) U.S. Cl.
CPC .......... *H01L 23/544* (2013.01); *G06N 10/00* (2019.01); *G06T 7/0008* (2013.01); *H01L 27/18* (2013.01); *H01L 39/223* (2013.01); *H01L 39/2493* (2013.01); *G06T 2207/30148* (2013.01); *H01L 2223/54426* (2013.01)

(58) Field of Classification Search
CPC ................. H01L 23/544; H01L 29/66439
See application file for complete search history.

(56) References Cited

U.S. PATENT DOCUMENTS

2011/0121446 A1*  5/2011  Simmons .............. B82Y 10/00
                                                                  257/734

* cited by examiner

*Primary Examiner* — Thomas L Dickey
(74) *Attorney, Agent, or Firm* — Knobbe, Martens, Olson & Bear, LLP

(57) ABSTRACT

The present disclosure provides methods for fabricating multi-layered electronic architectures in silicon and/or germanium. In particular the disclosure provides an advanced marker design and a methodology for aligning devices on multiple layers of a multi-layered electronic architecture. The disclosure also provides a process for growing a semiconductor material with high quality surfaces.

19 Claims, 8 Drawing Sheets

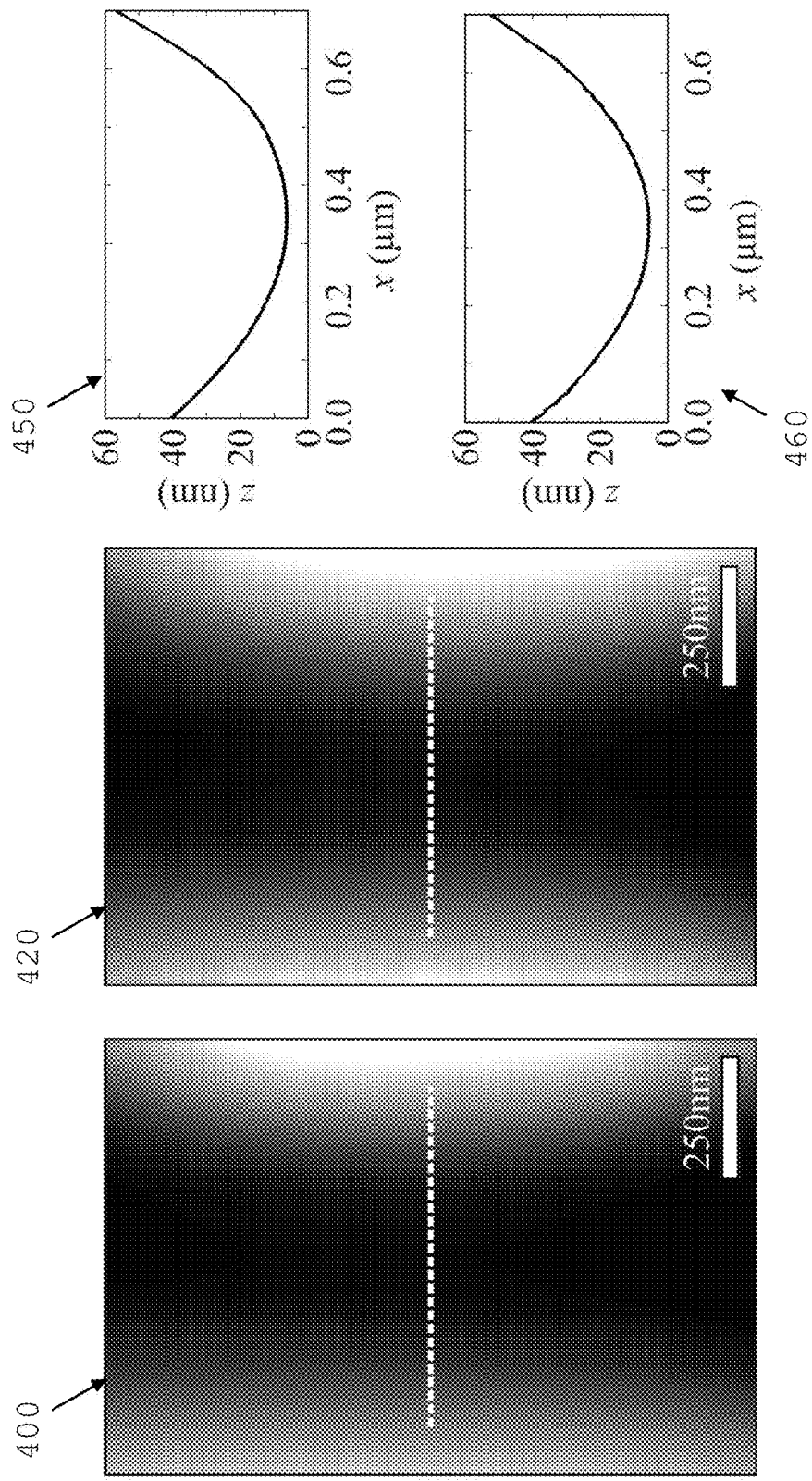

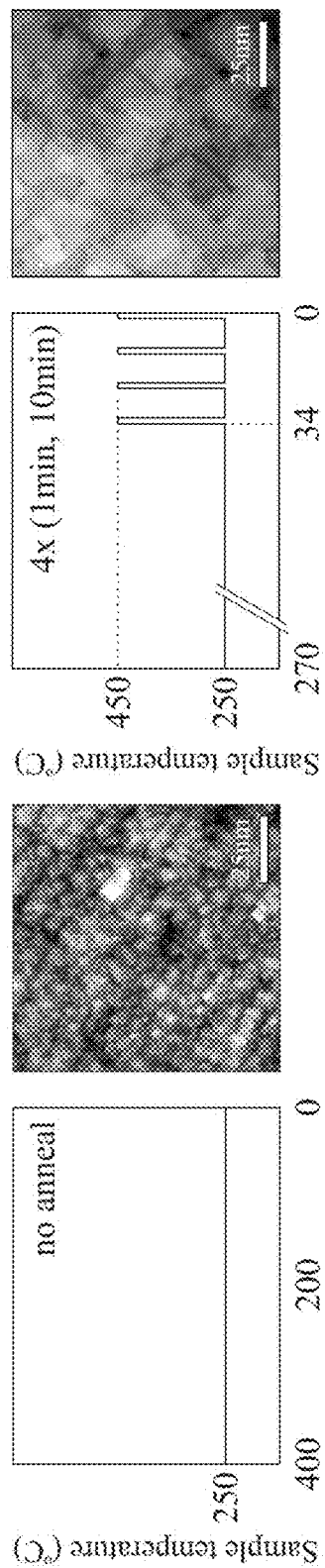
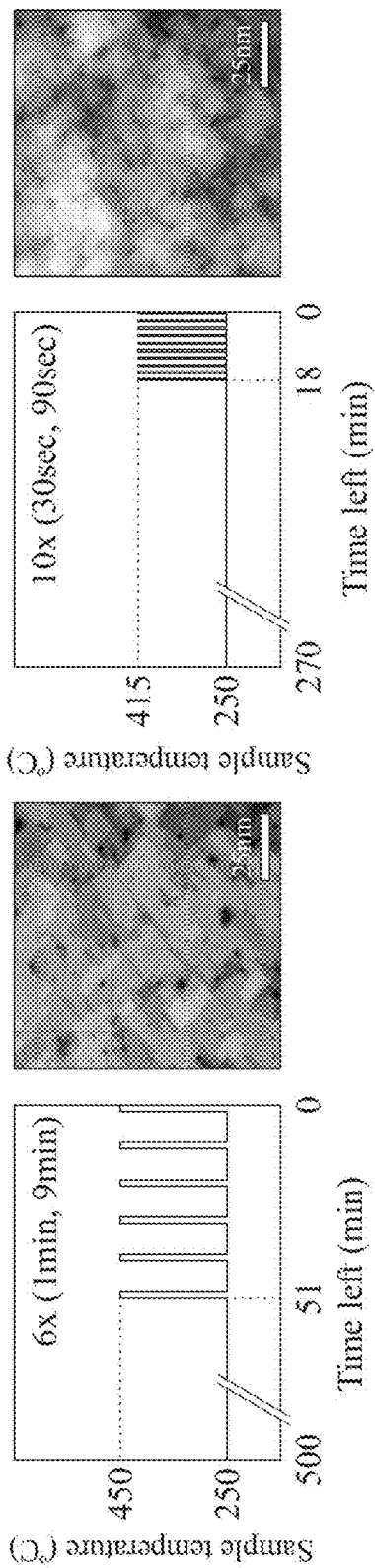
FIGURE 8(a)
FIGURE 8(b)
FIGURE 8(c)
FIGURE 8(d)

METHOD OF FABRICATING A THREE DIMENSIONAL ELECTRONIC STRUCTURE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present invention relates to methodologies for fabricating a three-dimensional electronic structure, and particularly, but not exclusively the invention relates to methodologies for improving interlayer device alignment in a multi-layered electronic structure with multiple active components.

Description of the Related Art

Multi-layered electronic structures can be fabricated using different methodologies, such as high precision lithography and semiconductor growth. The lithographic capabilities of Scanning Tunnelling Microscopes (STMs) have been used to enable atomic scale fabrication of small scale devices, such as single atom transistors and nanowires. The accuracy of current STM based fabrication methods may not be sufficient for the manufacturing of complex multi-layered quantum computing architectures.

U.S. patent application Ser. No. 14/931,768, filed Nov. 3, 2015, the disclosure of which is incorporated herein by reference, describes a scalable quantum computer architecture based on phosphorus donors in silicon and/or germanium. The architecture requires control gates above and below the donors to implement a three-dimensional surface code. This architecture demands atomically precise dopant placement on, not just one, but three planes of the silicon circuit. Such precision is difficult to achieve using techniques known in the art.

SUMMARY OF THE INVENTION

Embodiments of the invention propose methods for fabricating multi-layered electronic architectures in silicon and/or germanium. In accordance with embodiments the growth of silicon and/or germanium is manipulated to provide improved surfaces in conjunction with advanced device marker designs to achieve precise device placement.

In accordance with the first aspect, the present invention provides an alignment marker for aligning electronic devices arranged on different planes of a multi-layered semiconductor architecture; the marker having a trenched structure comprising: a central region arranged to host at least a portion of an electronic device; and a plurality of elongate regions radially extending from the central region; the plurality of elongate regions being arranged to host a plurality of conductive electrodes for control of the electronic device; wherein the trenched structure is arranged in a manner such that, when a layer of semiconductor material is grown onto the marker, a further trenched structure is replicated on a surface of the grown layer of semiconductor material.

In embodiments, the replicated trenched structure has a shape that is substantially similar to the shape of the original trenched structure. For example, the original trenched structure may have an atomically flat surface at the bottom of the trenches and a given slope of the wall portion that forms the trenches.

In some embodiments, the trenched structure further comprises peripheral contact regions at end portions of the elongate regions; the contact regions being arranged to host contact pads. The contact regions provide reference points as where to fabricate vias to form electrical contacts with the electronic device when the structure is observed with either an optical microscope, STM or an SEM.

In embodiments, the wall portion has a depth and a slope such that the marker is replicated with enough accuracy on a surface of the grown layer of semiconductor material even when the thickness of the grown layer of semiconductor material is more than 100 nm.

Advantageously, the layer of semiconductor material grows perpendicularly to the marker, therefore, the trenched structure that forms in the grown layer of semiconductor material is located right above the marker, with an accuracy of a few nanometers.

In embodiments, the central region of the marker has a surface suitable to host an electronic device fabricated using the lithographic capabilities of an STM.

In embodiments, the slope of the walls of the trenched structure are such that the electronic device and the electrodes can be fabricated without damaging the tip of the STM.

In embodiments, the alignment marker is formed into a flat semiconductor material surface. The semiconductor material surface may be suitable for further semiconductor material epitaxial growth.

In some embodiments, the trenched structure has a depth between 100 nm and 200 nm. The width of the trenches may be between 50 nm and 200 nm.

In some embodiments, the portion of the semiconductor material surface hosting the marker is annealed at temperatures up to 1100° C.

Further, in embodiments, the marker is covered with at least a 40 nm thick semiconductor material encapsulation layer.

Advantages of the alignment marker of the first aspect include the capability of the trench edges to stay flat and intact. This is important for STM lithography, and can enable an alignment accuracy on every subsequent layer of an STM fabricated multi-layered device below 20 nm. In some instances, accuracies below 10 nm can be obtained.

Advantageously, markers in accordance with the first aspect allow to avoid highly stepped areas and stay intact even after annealing the semiconductor material up to 1100° C. The marker reproduces with sufficient fidelity and contrast on the surface of a layer of semiconductor material thicker than 200 nm grown onto the marker.

Further, the geometry of the marker allows for precise measurement and alignment in multiple directions. Another advantage provided by the marker is that the step of performing STM lithography on the steep semiconductor material wall sides during fabrication can be avoided.

In embodiments, the semiconductor material is high purity crystalline silicon. In alternative embodiments, the semiconductor material is crystalline germanium or a silicon-germanium alloy.

In accordance with the second aspect, the present invention provides a method for aligning electronic elements on different planar surfaces of a multi-layered architecture with respect to each other; the method comprising the steps of: providing a first planar surface of a semiconductor material comprising at least one marker in accordance with the first aspect and a first electronic element formed on the bottom of the trenched structure of the marker; imaging the at least one marker with the electronic element; determining the position of a reference point on the marker by using image data; determining an offset between the reference point and the electronic element; growing a further layer of the semiconductor material on the first planar surface in a manner such that the at least one marker is reproduced on a second planar surface; the second planar surface being a planar surface of the grown layer of the semiconductor material; forming a second electronic element in the reproduced marker whereby the position of the second electronic element in the reproduced marker is based on the position of the reference point and offset of the first electronic element.

In embodiments, the step of forming a second electronic element in the reproduced marker comprises the steps of: imaging the reproduced marker; determining the position of the reference point on the reproduced marker by using image data; determining the position of the second electronic element based on the position of the reference point on the reproduced marker and the offset; forming the second electronic element at the position of the second electronic element.

The second electronic element may be formed using the lithography capabilities of an STM.

In embodiments, the position of a reference point on the marker, either the one of the first planar surface or the one reproduced on the grown surface, is determined by finding the intersection region of the central axis of each of the elongate trenched regions.

In embodiments, the second planar surface is the surface of an epitaxial silicon layer formed on the first planar surface. The epitaxial silicon layer may have a thickness of about 100 nm.

In some embodiments, the method comprises the step of forming a narrower neck portion in one of the elongate regions of the trenched structure and using the neck portion as a reference for positioning the electronic element.

In accordance with the third aspect, the present invention provides a method for growing a layer of silicon material on a silicon surface; the method comprising the steps of: maintaining the temperature of the silicon material between 200° C. and 300° C. for the majority of growth process; providing a plurality of high temperature pulses by rapidly increasing the temperature of the silicon material to between 400° C. and 500° C.; wherein the high temperature pulses enable silicon atoms to overcome an energy barrier at atomic step edges and allow for a final surface of the grown silicon layer that has an island size between 100 $nm^2$ and 200 $nm^2$.

In accordance with the fourth aspect, the present invention provides a method for growing a layer of germanium material on a surface; the method comprising the steps of: maintaining the temperature of the germanium material between 50° C. and 300° C. for the majority of growth process; providing a plurality of high temperature pulses by rapidly increasing the temperature of the germanium material to between 100° C. and 500° C.; wherein the high temperature pulses enable germanium atoms to overcome an energy barrier at atomic step edges and allow for a final surface of the grown silicon layer that has an island size between 100 $nm^2$ and 200 $nm^2$.

Thus, the increased surface diffusion reduces the chance for nucleation on top of the islands allowing existing vacancies in the lower layers to be filled up.

In some embodiments, the root mean square of features height on the final surface is between 0.10 nm and 0.20 nm.

In embodiments, the time duration of the high temperature pulses is between 30 seconds and 90 seconds. A high temperature pulse may be provided every 1 minute to 10 minutes. A total of 4 to 15 high temperature pulses may be provided during the entire growth of the layer.

Advantages of the methodologies of the third and fourth aspects include the improved contrast between the planar surface and the markers that allow for improved device alignment. Furthermore, the atomically flatter surface enables STM lithography and improves the quality of the electronic elements formed. Surfaces with poor morphology cannot be used for STM lithography.

Embodiments of the invention in accordance with the first, second and third aspects above, facilitate the manufacturing of a multi-layered silicon or germanium architecture that hosts quantum bits based on phosphorus atoms. In addition to the quantum bits, the architecture hosts control devices and electrodes that are arranged in a three dimensional structure. These devices include single electron transistors, charge controllers, coupling devices and large elongated control electrodes.

The architecture can be built using a bottom-up approach and starting from a high quality silicon or germanium surface. Devices can be formed on each layer using the lithographic capabilities of an STM in combination with the absorption and incorporation of $PH_3$ and molecular beam epitaxy of silicon or germanium.

BRIEF DESCRIPTION OF THE DRAWINGS

Features and advantages of the present invention will become apparent from the following description of embodiments thereof, by way of example only, with reference to the accompanying drawings, in which:

FIG. 4(a) shows a comparison of a portion of a marker on two surfaces of a multi-layered device;

FIG. 4(b) shows a portion of an elongate region of a marker formed on a silicon surface replicated on a silicon layer with a thickness of about 80 nm grown on the marker;

FIG. 4(c) shows a depth profile comparison;

FIGS. 8(a), 8(b), 8(c), and 8(d) show the constant temperature annealing profile process and an image of the silicon surfaces obtained using this process.

DETAILED DESCRIPTION OF THE PREFERRED EMBODIMENT

In the following description a marker and a method for improving device alignment in a multi-layered electronic structure with multiple active components is disclosed. In addition, the following description discloses a method for controlling the growth of silicon to provide improved surfaces for use in conjunction with the new marker designs to achieve improved device placement.

The fabrication of high precision multi-layer microelectronic structures is a key enabler for the fabrication of the quantum computing architecture proposed in U.S. patent application Ser. No. 14/931,768. Atomic-scale fabrication in silicon has been previously demonstrated in a plane. However, the architecture mentioned above has the dopants control gates above and below the donors, requiring very high precision multi-layer electronic fabrication.

Figures 1A, 1B:
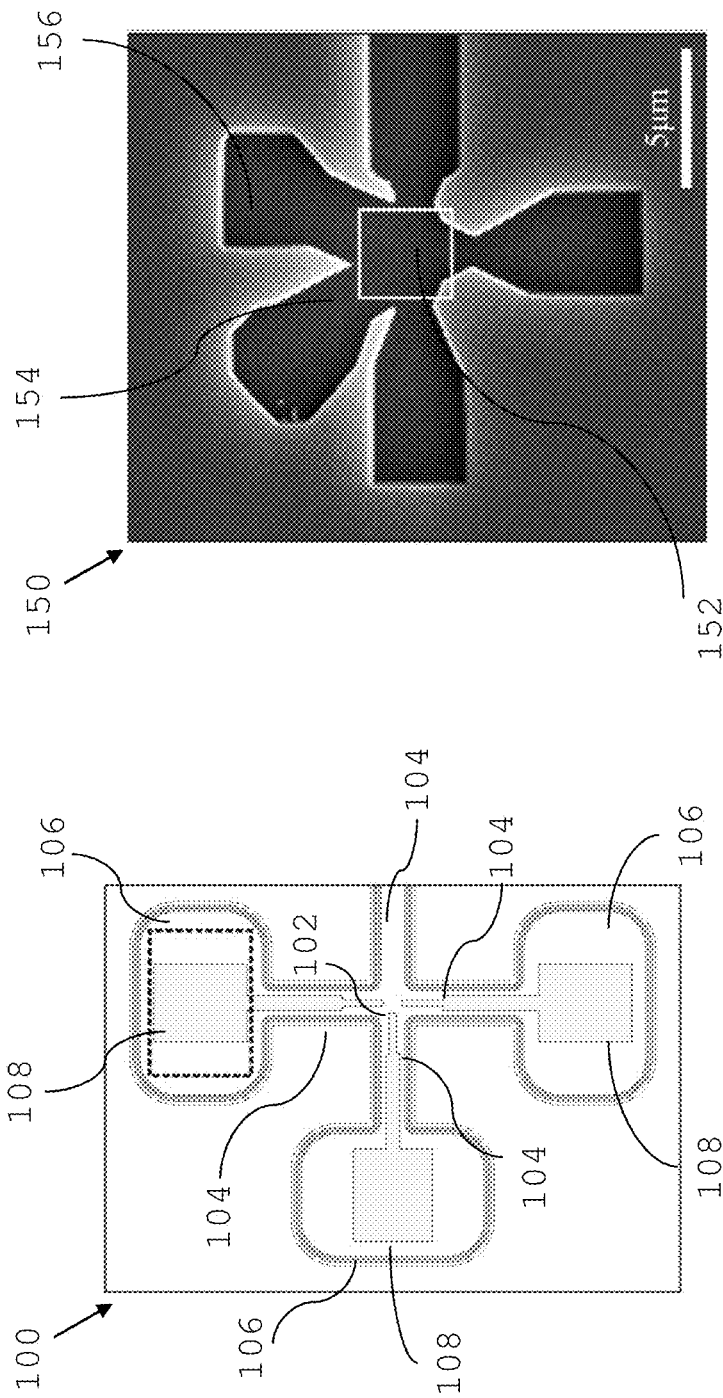
FIG. 1(a) shows a schematic representation and an SEM image of a marker.
FIG. 1(b) shows an SEM image of a marker.

Referring now to FIG. 1(a), there is shown a schematic representation of a marker 100 in accordance with embodiments. FIG. 1(b) shows an SEM image 150 of a marker. Marker 100 is formed on a flat silicon surface which can be the surface of a silicon wafer or the surface of a layer of silicon grown on a silicon wafer. Marker 100 has a trenched structure that comprises a central region 102 and a plurality of elongate regions 104. The light grey areas in the trench represent the STM lithography and the region of the dotted box is where the vias to contact to the lithography layer are fabricated.

Elongate regions 104 extend radially from central region 102. Further, marker 100 has a peripheral contact regions 106 at end portions of elongate regions 104.

Marker 100 is configured so that a microelectronic element or device can be fabricated at the bottom of the trenched structure. Further, an additional layer of silicon can be grown onto the marker and the device and so that a further trenched structure is replicated on the surface of the grown layer of silicon allowing for alignment of a further electronic device to the device fabricated at the bottom of the trenched structure of marker 100.

At least a portion of the device or element fabricated at the bottom of the trenched structure is located in central region 102, whilst elongate regions 104 host conductive electrodes 108 that allow to control the microelectronic device.

Peripheral contact regions 106 are designed to host conductive contact pads and provide reference points as where to fabricate vias that form electrical contacts with the electronic device when the marker structure is observed with either an optical microscope or an SEM.

FIG. 1(b) shows an SEM image of a marker 150. The central region 152 is indicated by a square in the middle of the mark for convenience. Marker 150 also shows narrow elongate regions 154 and peripheral contact regions 156.

The marker design is specific to the specific electronic device geometry and can be adapted to accommodate devices with a different number of leads and/or design geometry.

Figure 2B:
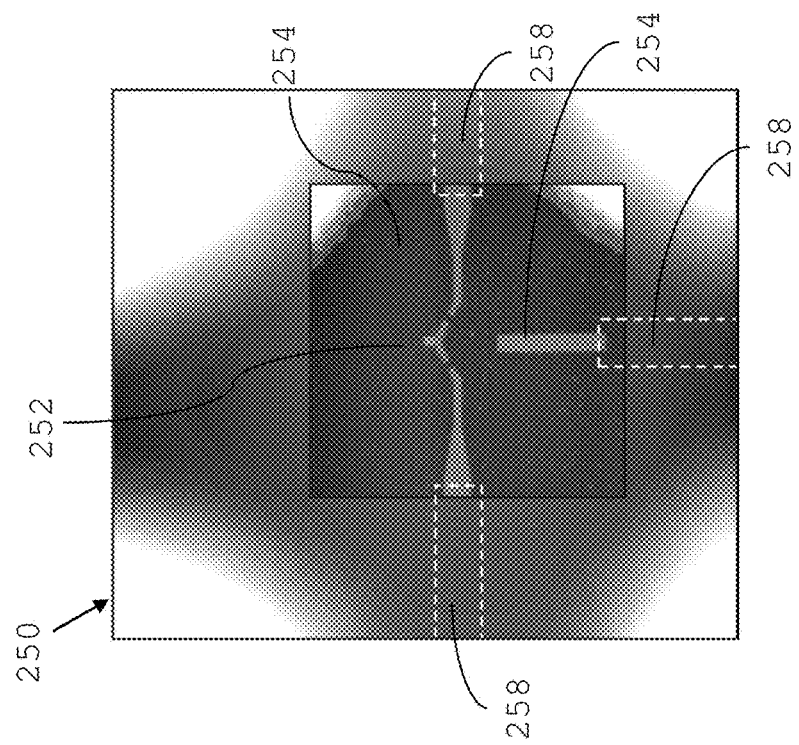
FIG. 2(b) shows an image of the inner region of the marker of the initial surface, superimposed with a higher definition STM image of the STM lithography of the electronic device.
Figure 2A:
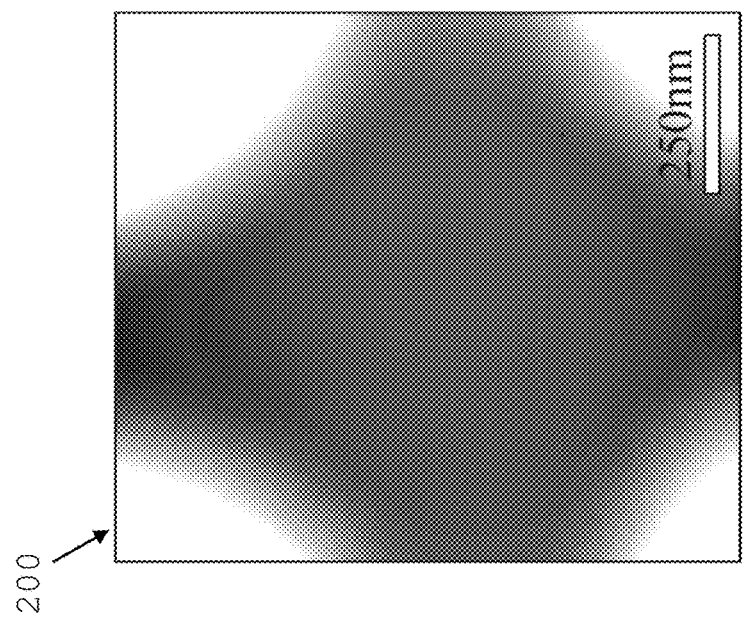
FIG. 2(a) shows STM images of markers and an electronic device.

Referring now to FIG. 2(a), there is shown an image 200 of the marker formed on a silicon surface. The trenched structure has an atomically flat surface at the bottom of the trenches and a gradual slope of the wall portion that forms the trenches and allows device fabrication by STM lithography. The marker trench depth is 100 nm.

A silicon layer can be grown perpendicularly to the initial surface with the marker. Therefore, the trenched structure replicated at the top surface of the grown silicon layer with an accuracy of a few nanometers.

Referring now to FIG. 2(b), there is shown an image 250 of the inner region of the marker of the initial surface, superimposed with a higher definition STM image of the STM lithography of the electronic device. FIG. 2(b) shows an SET device located in the central region 252 of the marker and control electrodes located in the radial elongate portions 254 of the trenched structure. The peripheral regions 258 can host metallic pads for contacting the electrodes.

Figures 3A, 3B:
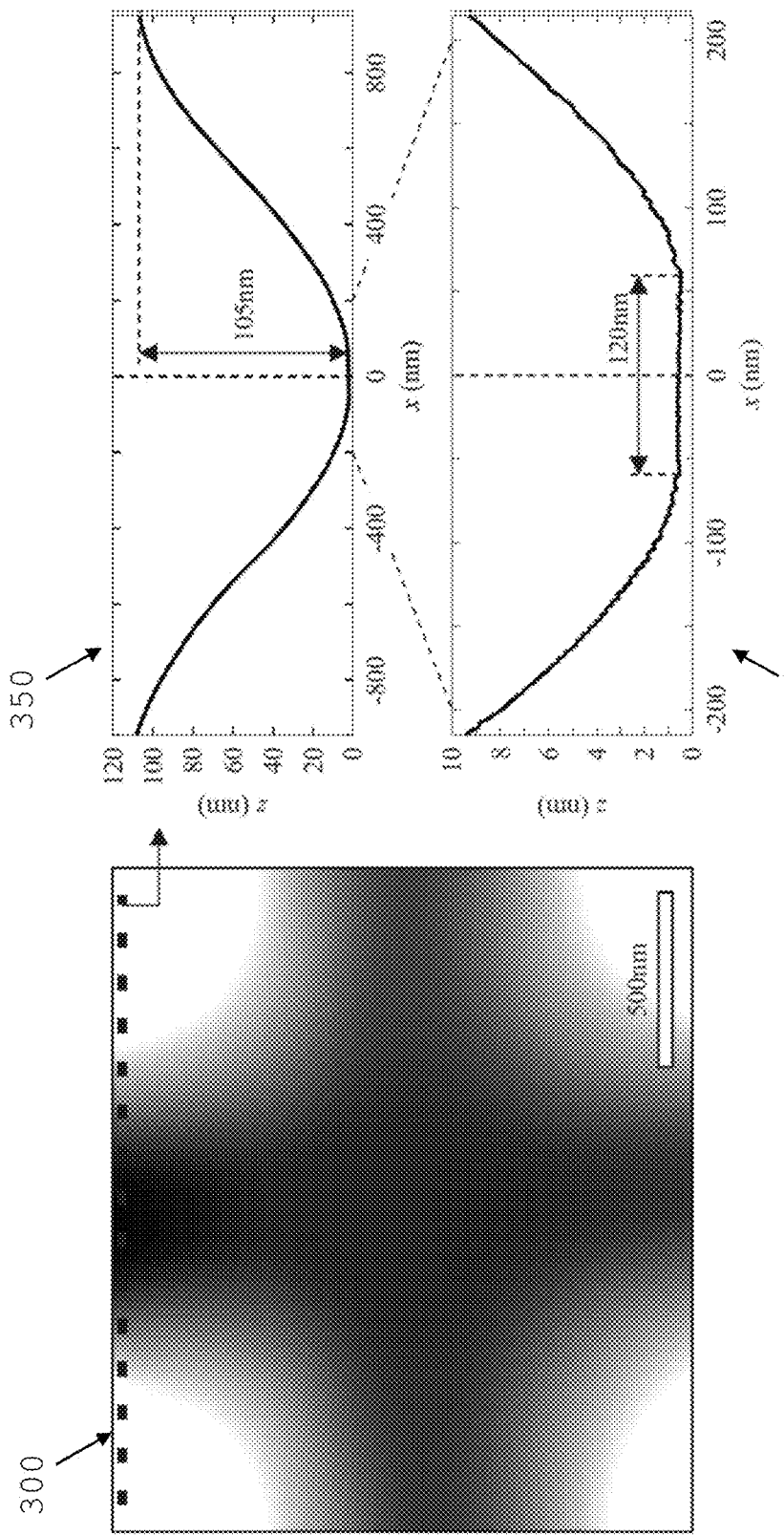
FIG. 3(a) shows STM line profile data of marker depth.
FIG. 3(b) shows an image of a marker of the marker depth.

FIG. 3 shows an image 300 of a marker (a) and line profile data 350, 352 of the marker depth (b).

Plot 350 shows that the slope of the walls of the trenched structure are such that the electronic device and the electrodes can be fabricated without damaging the tip of the STM.

Plot 360 shows a particular of the central region of the trench. Here the flat central portion of the trench is shown and has a width of 120 nm. The flat region of the trench is where the majority of the electronic device or electrode are formed using the STM.

The trenched structure has a depth of about 100 nm in the plots shown in FIG. 3, but can be deeper in some instances. The width of the trench can vary depending on the device being fabricated. The width measured at half the depth is generally between 50 nm and 200 nm and allows to have a central flat surface with a sufficient width to form devices and a good slope of the trench wall for STM lithography.

Advantages of the alignment marker of the first aspect include the capability of the trench edges to stay flat and intact. This is important for STM lithography, and can enable alignment with 20 nm accuracy on every layer of an STM fabricated multi-layered device. In some instances, accuracies below 10 nm can be obtained.

Referring now to FIG. 4(a), there is shown a portion of an elongate region of a marker 400 formed on a silicon surface. FIG. 4(b) shows the same portion replicated on a silicon layer 420 with a thickness of about 80 nm grown on the marker.

The replicated trenched structure 420 is similar to the structure of the original trenched structure 400. A depth profile comparison is shown in FIG. 4(c). The width of the trenches at the surface of the grown layer of silicon and the surface flatness are only weakly influenced by the 80 nm grown silicon encapsulation layer. The layer of silicon grows perpendicularly to the marker, therefore, the trenched structure that forms in the grown layer of silicon is located right above the marker, within an accuracy of a few nanometers. The geometry of the marker allows for precise alignment in multiple directions.

Figure 5:
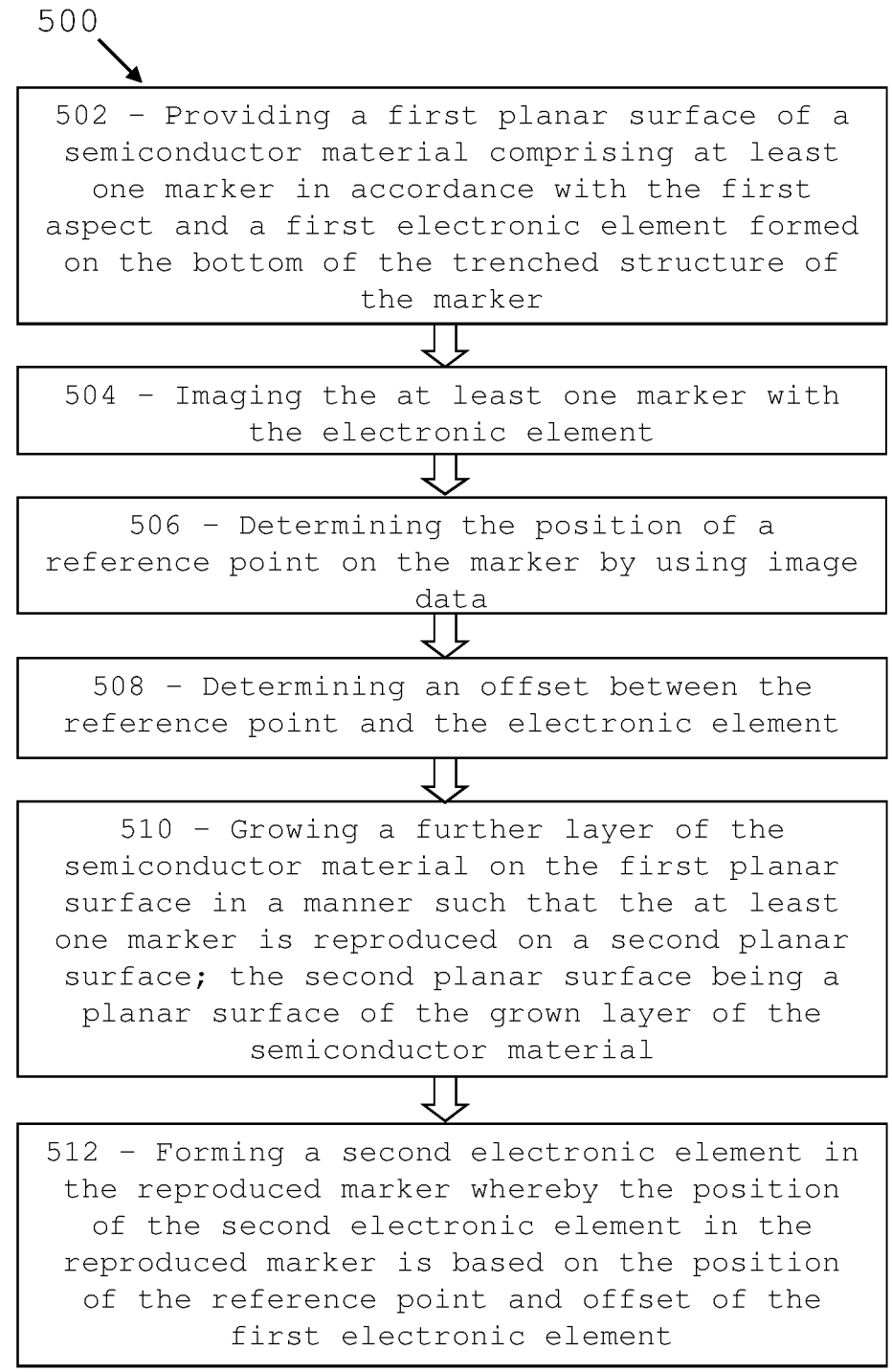
FIG. 5 shows a flow diagram with steps used to perform alignment.

Referring now to FIG. 5 there is shown a flow diagram 500 with steps used to perform the alignment of electronic elements on different silicon planar surfaces.

At step 502, a first planar surface of a semiconductor material (silicon in the embodiments described) comprising at least one marker as described above is provided. A first electronic element is formed on the bottom of the trenched structure of the marker.

The marker and the electronic element are imaged at step 504 and the position of a reference point on the marker is determined by using image data at step 506. Once the reference point is determined on the image, an offset between the reference point and the electronic element can be determined at step 508.

The data is stored and subsequently the encapsulation layer of semiconductor material is grown on the first planar surface onto the marker so that the marker is reproduced on the surface of the encapsulation layer, step 510.

At step 512, a second electronic element or device if formed in the reproduced marker in a position based on the position the reference point and offset calculated in steps 504 to 508.

In order to form the electronic element on the surface of the encapsulation layer an image of the reproduced marker is taken and the position of the reference point on the image is determined. The electronic element is formed in the reproduced marker at a distance from the determined reference point based on the original offset determined at step 508.

Figure 6:
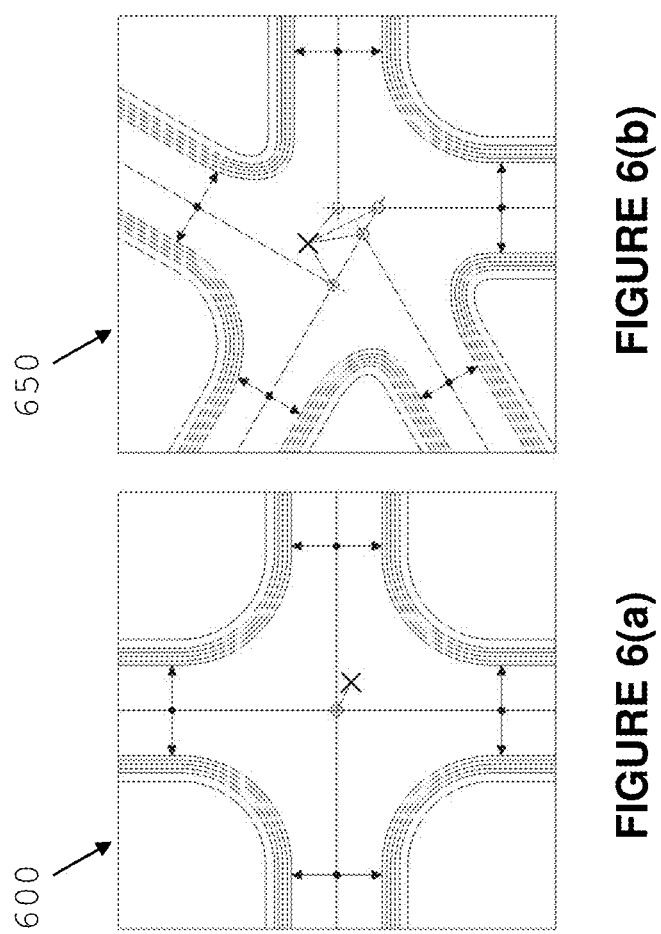
FIG. 6(a) shows schematic diagrams of markers with alignment lines.
FIG. 6(b) shows a marker with 5 trenches in a more complex structure.

FIGS. 6(a) and 6(b) show schematic representations of two markers central axis lines that meet in the central region of the marker at a reference point.

FIG. 6(a) shows a marker 600 with a 'cross' configuration. In this marker the central axis of the trenches meet in the center of the central region of the marker. This single intersection point can be used as a reference point for alignment.

FIG. 6(b) shows a marker with 5 trenches in a more complex structure. As discussed above, the structure of the marker is related to the typology of the device being fabricated. In the marker of FIG. 6(b), the axis of the trenches do not meet in a single point. Five different points, all located in the central region of the marker, are available to be used as reference points for alignment.

In some instances, the reference point can be determined using other geometrical features of the marker. For example, the elongate regions of the trenched structure can have narrower neck portions that facilitate alignment providing an additional reference for positioning the electronic element.

The accuracy of the alignment and the ability of resolving the marker in sufficient detail on the surface of the encapsulation layer are strictly related to the quality and flatness of the surface.

The Applicants have found that the growth manipulation of the encapsulation layer allows to generate flatter and better quality surfaces that facilitate alignment.

Figure 7:
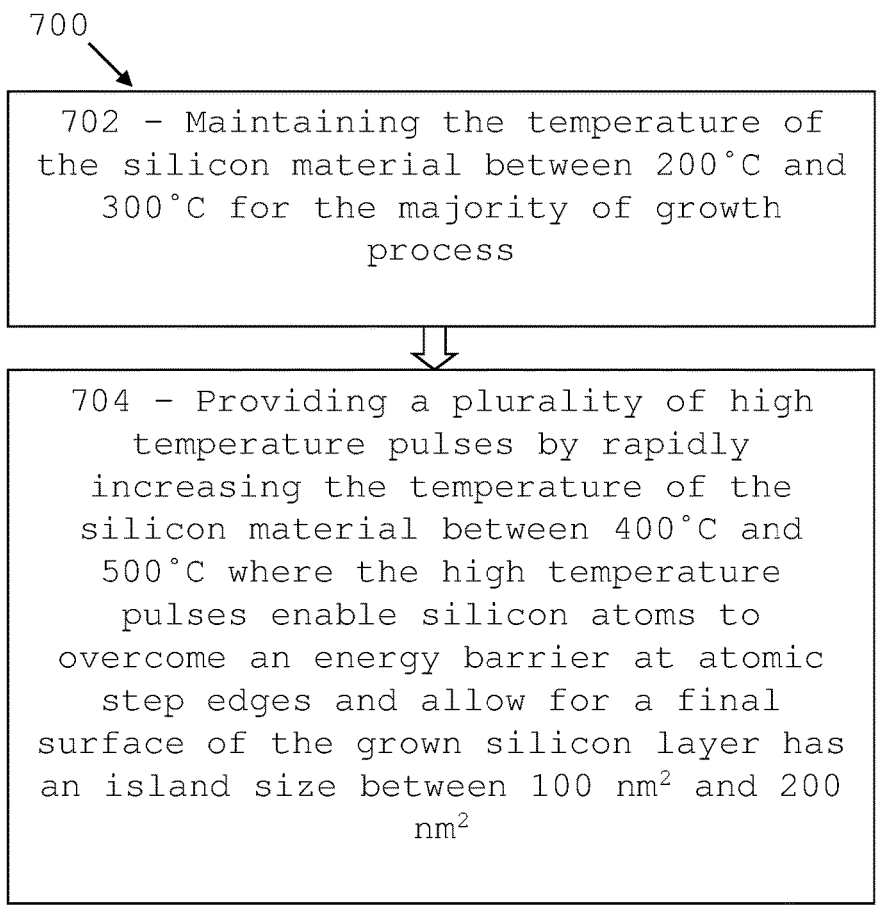
FIG. 7 shows a flow diagram with steps used to perform semiconductor growth.

Referring now to FIG. 7, there is shown a flow diagram 700 with steps for performing growth to improve surface quality.

During growth, the temperature of the silicon material is maintained between 200° C. and 300° C. for the majority of growth process, step 702. However, in the last hour of the growth process, a plurality of high temperature pulses are provided by rapidly increasing the temperature of the silicon material to between 400° C. and 500° C., step 704. The high temperature pulses enable silicon atoms to overcome an energy barrier at atomic step edges and allow for a final surface of the grown silicon layer that has an island size between 100 $nm^2$ and 200 $nm^2$. The increased surface diffusion reduces the chance for nucleation on top of the islands allowing existing vacancies in the lower layers to be filled up.

FIGS. 8(a), 8(b), 8(c), and 8(d) show four annealing profiles for MBE silicon growth and respective silicon surfaces.

Current STM patterned devices are encapsulated with epitaxial silicon grown at a sample temperature of 250° C. FIG. 8(a) shows the constant temperature annealing profile process and an image of the silicon surfaces obtained using this process. The quality of these surfaces is insufficient to perform alignment using the marker and the methodology described herein. Rough surfaces makes STM lithography unviable as the height of a dangling bond in STM imaging is comparable to the height of a silicon step edge.

Growing at higher substrate temperatures reduces the surface roughness but leads to segregation of the phosphorus atoms and phosphorus desorption limiting the thermal budget available for flattening the surface.

By using growth manipulation, as shown in FIGS. 8(b), 8(c), and 8(d), the mobility of the Si-adatoms can be increased to overcome the energy barrier at atomic step edges. This reduces the chance for nucleation on top of the islands.

The growth manipulation technique involves growing the silicon layer at 250° C. for the majority of the growth period and applying 30 s to 90 s rapid thermal annealing pulses to bring the temperature in the 400° C. to 500° C. range. The pulses are applied in the last phase of the growth as shown in FIGS. 8(b), 8(c), and 8(d). The duration and the number of applied pulses may vary depending on the quality of the surface desired.

This technique provides a compromise to guarantee minimal dopant diffusion and segregation while still achieving a flat silicon substrate suitable for STM lithography. FIGS. 8(b), 8(c), 8(d) also show images of the surfaces obtained using the respective annealing processes. Silicon island sizes between 100 $nm^2$ and 200 $nm^2$ are obtained depending on the applied process. These island size are compatible with STM lithography.

The new marker, the alignment methodology and the silicon growth process described herein facilitate the manufacturing of a multi-layered silicon architecture that hosts quantum bits based on phosphorus atoms. In addition to the quantum bits, the architecture hosts control devices and electrodes that are arranged in a three dimensional structure. These devices include single electron transistors, charge controllers, coupling devices and large elongated control electrodes.

The architecture can be built using a bottom-up approach and starting from a high quality silicon surface. Devices can be formed on each layer using the lithographic capabilities of an STM in combination with the absorption and incorporation of $PH_3$ and molecular beam epitaxy of silicon.

The Applicants have also demonstrated the ability to perform high fidelity single shot spin readout on a donor based quantum dot using a vertically gated single electron transistor fabricated using a marker and a method for growing epitaxial silicon as disclosed herein. The results demonstrated the capability of the method to align vertical gates with an accuracy below 20 nm and grow atomically smooth surfaces for multilayer atomically precise patterning. These capabilities are crucial to fabricate crystalline devices in silicon with atomic precision in all three dimensions, which is an essential requirement for manufacturing a scalable donor based surface code quantum computer.

The single shot spin readout experiments with a vertical placed gate embedded in a fully crystalline device showed a relaxation time $T_1$ of 2.705 s and 0.344 s for the 2*n+1 and 2*n+3 electron at 2.0 T. The high stability of the device reflects in a readout fidelity of 97%.

By using the techniques disclosed herein, the Applicants have demonstrated for the first time single shot spin readout with a vertically gated crystalline single electron transistor. The vertical top gate, placed with an alignment precision of less than 20 nm, does not reduce the gate range or the stability of the charge sensor. Indeed the new silicon growth methodology may promote the high stability of the device. The growth methodology allows flattening the silicon surfaces and can potentially reduce defects in the encapsulation layer. The high device stability is also visible in a single shot spin readout fidelity of 97%.

In the embodiment described above, the semiconductor material used is crystalline silicon. The alignment marker and alignment methodology described can be used in a similar manner for crystalline germanium or a silicon-germanium alloy. The growth methodology described can also be used for germanium layers by modifying the temperature ranges.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

What is claimed is:

1. An alignment marker for aligning electronic devices arranged on different planes of a multi-layered semiconductor architecture, the marker having a trenched structure comprising:
    a central region arranged to host at least a portion of an electronic device, wherein the central region is located at a bottom of the trenched structure; and
    a plurality of elongate regions radially extending from the central region, the plurality of elongate regions being arranged to host a plurality of conductive electrodes for control of the electronic device,
    wherein the trenched structure is arranged in a manner such that, when a layer of semiconductor material is grown onto the marker, a further trenched structure is replicated on a surface of the grown layer of semiconductor material.

2. The alignment marker of claim 1, wherein the replicated trenched structure has a shape that is substantially similar to the shape of the original trenched structure.

3. The alignment marker of claim 1, wherein the trenched structure further comprises peripheral contact regions at end portions of the elongate regions, the contact regions being arranged to host contact pads.

4. The alignment marker of claim 1, wherein the wall portion has a depth and a slope such that the marker is replicated with enough accuracy on a surface of the grown layer of semiconductor material when the thickness of the grown layer of semiconductor material is more than 100 nm.

5. The alignment marker of claim 1, wherein the trenched structure that forms in the grown layer of semiconductor material is located above the marker, with an accuracy of about 20 nm.

6. The alignment marker of claim 1, wherein the central region of the marker has a surface suitable to host an electronic device fabricated using the lithographic capabilities of an STM or SEM.

7. The alignment marker of claim 1, wherein the trenched structure has a depth between about 100 nm and about 200 nm.

8. The alignment marker of claim 1, wherein the width of the trenched structure at half depth is between about 50 nm and about 200 nm.

9. The alignment marker of claim 1, wherein the trenched structure has a substantially flat region at the bottom of the trenches and the flat region has a width between about 100 nm and about 150 nm.

10. The alignment marker of claim 1, wherein the semiconductor material is crystalline silicon, crystalline germanium or a silicon-germanium alloy.

11. A method for aligning electronic elements on different planar surfaces of a multi-layered architecture with respect to each other, the method comprising the steps of:
    providing a first planar surface of a semiconductor material comprising at least one marker in accordance with any one of the preceding claims and a first electronic element formed on the bottom of the trenched structure of the marker;
    imaging the at least one marker with the electronic element;
    determining the position of a reference point on the marker by using image data;
    determining an offset between the reference point and the electronic element;
    growing a further layer of the semiconductor material on the first planar surface in a manner such that the at least one marker is reproduced on a second planar surface; the second planar surface being a planar surface of the grown layer of the semiconductor material; and
    forming a second electronic element in the reproduced marker whereby the position of the second electronic element in the reproduced marker is based on the position of the reference point and offset of the first electronic element.

12. The method of claim 11, wherein the step of forming a second electronic element in the reproduced marker comprises the steps of:
    imaging the reproduced marker;
    determining the position of the reference point on the reproduced marker by using image data;
    determining the position of the second electronic element based on the position of the reference point on the reproduced marker and the offset;
    forming the second electronic element at the position of the second electronic element.

13. The method of claim 11, wherein the position of a reference point on the marker, on the first planar surface or the grown surface, is determined by finding an intersection region of the central axis of each of the elongate trenched regions.

14. The method of claim 11, wherein the second planar surface is the surface of an epitaxial silicon layer formed on the first planar surface.

15. The method of claim 11, wherein the method comprises the step of forming a narrower neck portion in one of the elongate regions of the trenched structure and using the neck portion as a reference for positioning the electronic element.

16. The method of claim 11, wherein the semiconductor material is crystalline silicon, crystalline germanium or a silicon-germanium alloy.

17. A multi-layered electronic architecture comprising a plurality of electronic elements distributed on two or more planes of the architecture, the electronic elements being vertically aligned across planes with an accuracy below 20 nm using a marker in accordance with claim 1.

18. The multi-layered electronic architecture of claim 17, wherein the architecture comprises a silicon layer.

19. The multi-layered electronic architecture of claim 17, wherein the architecture comprises:
    a plurality of qubit elements disposed in a two-dimensional matrix arrangement across the architecture; and a plurality of control members, each control member being arranged to control a plurality of qubits of the architecture.

\* \* \* \* \*